(12) United States Patent
Sato

(10) Patent No.: US 9,906,009 B2
(45) Date of Patent: Feb. 27, 2018

(54) SEMICONDUCTOR MODULE

(71) Applicant: FUJI ELECTRIC CO., LTD., Kawasaki-shi (JP)

(72) Inventor: Tadahiko Sato, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 314 days.

(21) Appl. No.: 14/842,768

(22) Filed: Sep. 1, 2015

(65) Prior Publication Data
US 2015/0372471 A1 Dec. 24, 2015

Related U.S. Application Data

(63) Continuation of application No. PCT/JP2014/063555, filed on May 22, 2014.

(30) Foreign Application Priority Data

Jun. 20, 2013 (JP) .................. 2013-129706

(51) Int. Cl.
*H02H 3/00* (2006.01)
*H02H 1/00* (2006.01)
*H01L 25/07* (2006.01)
*H01L 25/18* (2006.01)
*H02M 7/48* (2007.01)
*H02M 7/5387* (2007.01)
(Continued)

(52) U.S. Cl.
CPC ..... *H02H 1/0046* (2013.01); *H01L 23/49575* (2013.01); *H01L 25/07* (2013.01); *H01L 25/18* (2013.01); *H02H 3/08* (2013.01); *H02H 5/04* (2013.01); *H02H 7/122* (2013.01); *H02M 7/48* (2013.01); *H02M 7/5387* (2013.01); *H01L 2224/45144* (2013.01); *H01L 2224/48137* (2013.01); *H01L 2224/48139* (2013.01); *H01L 2224/48247* (2013.01); *H01L 2224/49171* (2013.01); *H01L 2924/13055* (2013.01); *H02M 7/003* (2013.01)

(58) Field of Classification Search
CPC .................................................. H02H 1/0046
USPC .......................................................... 361/18
See application file for complete search history.

(56) References Cited

U.S. PATENT DOCUMENTS 5,528,446 A * 6/1996 Sankaran ............. G01R 31/006
361/103
5,773,883 A * 6/1998 Majumdar ............ H02M 7/003
257/698
(Continued)

FOREIGN PATENT DOCUMENTS

JP H03-175513 A 7/1991
JP H04-98950 A 3/1992
(Continued)

*Primary Examiner* — Stephen W Jackson
(74) *Attorney, Agent, or Firm* — Raino & Berdo, P.C.

(57) ABSTRACT

A semiconductor module which includes a plurality of control circuits that respectively drive a plurality of semiconductor elements on and off and a plurality of signal output circuits for the respective control circuits and which output operation status information, where the signal output circuits are respectively provided with signal output terminals having an open-drain configuration, and the signal output terminals each are connected to an internal lead frame on which the power semiconductor elements and the control circuits are mounted.

15 Claims, 5 Drawing Sheets

(51) Int. Cl.
  *H01L 23/495* (2006.01)
  *H02H 3/08* (2006.01)
  *H02H 5/04* (2006.01)
  *H02H 7/122* (2006.01)
  *H02M 7/00* (2006.01)

(56) References Cited

U.S. PATENT DOCUMENTS

| | | | | |
|---|---|---|---|---|
| 6,541,838 B1 * | 4/2003 | Suetsugu | ............... | H01L 24/49 |
| | | | | 257/500 |
| 7,605,579 B2 * | 10/2009 | Betser | .................. | H02M 3/073 |
| | | | | 324/76.11 |

FOREIGN PATENT DOCUMENTS

| JP | H09-172470 A | 6/1997 |
|---|---|---|
| JP | H09-191659 A | 7/1997 |
| JP | H11-187668 A | 7/1999 |
| JP | H11-252785 A | 9/1999 |
| JP | 2002-185295 A | 6/2002 |
| JP | 3394377 B2 | 4/2003 |
| JP | 3941246 B2 | 7/2007 |

* cited by examiner

SEMICONDUCTOR MODULE

CROSS-REFERENCE TO RELATED APPLICATIONS

The present application claims priority from PCT/JP2014/063555, filed May 22, 2014, which in turn claims priority from Japanese Patent Application 2013-129706, filed Jun. 20, 2013, both of which are hereby incorporated by reference.

TECHNICAL FIELD

The present invention relates to a semiconductor module provided with a plurality of power semiconductor elements, and a plurality of control circuits which respectively drive these semiconductor elements on and off.

BACKGROUND ART

A semiconductor module provided with a plurality of switching elements, and a plurality of control circuits which respectively drive the switching elements on and off, is used as a constituent component of an inverter device for driving a load, such as a motor. FIG. 4 is a diagram showing the principal schematic configuration of a semiconductor module IPM which is used in an inverter device that drives a tri-phase motor M; wherein Q1, Q2 to Q6 are six switching elements which respectively form three half-bridge circuits.

Furthermore, D1, D2 to D6 are freewheeling diodes which are respectively connected inversely in parallel to the switching elements Q1, Q2 to Q6.

Here, in the three half-bridge circuits, the switching elements Q1, Q2, Q3, which are connected commonly to a power source terminal P to which a DC voltage is applied, and which form an upper arm, and the switching elements Q4, Q5, Q6, which form a lower arm, are configured so as to be connected directly to each other. In these half-bridge circuits, the connection points between the switching elements Q1 (Q2, Q3) which form the upper arm and the switching elements Q4 (Q5, Q6) which form the lower arm become output terminals L1 (L2, L3) which supply power to the U (V, W) phases of the tri-phase motor M.

Furthermore, the other ends of the switching elements Q4, Q5, Q6 which form the lower arm are respectively connected to ground-side terminals N1, N2, N3. These ground-side terminals N1, N2, N3 are grounded via shunt resistors R1, R2, R3, for example. The switching elements Q1, Q2 to Q6 are power semiconductor elements constituted by IGBTs or MOS-FETs provided with a gate, which is a control electrode. A semiconductor module IPM having a configuration of this kind is introduced in detail in Japanese Patent No. 3394377, for example.

The control circuits IC1 to IC6 which are provided in the semiconductor module IPM and which respectively drive the switching elements Q1, Q2 to Q6 on and off are provided with output amplifiers A1 to A6 as drive circuits which apply a drive signal to the gate of the switching elements Q1, Q2 to Q6, as shown in FIG. 5, for example. Furthermore, the control circuits IC1 to IC6 are respectively provided with abnormality detection circuits ED1 to ED6 which detect abnormalities such as overcurrent or overheating in the switching elements Q1, Q2 to Q6, by monitoring the current which flows to the switching elements Q1, Q2 to Q6, and/or the operating temperature, and the like.

The semiconductor module IPM is configured so as to prohibit the operation of the output amplifiers A1 to A6 via the output control circuits C1 to C6, thereby protecting the switching elements Q1, Q2 to Q6, when an abnormality is detected by the abnormality detection circuits ED1 to ED6. Furthermore, simultaneously, the semiconductor module IPM is configured so as to externally output, via the switching elements S1 to S6, for example, abnormality information about overcurrent and/or overheating, etc. that has been detected by the abnormality detection circuits ED1 to ED6, as operating status information for the control circuits IC1 to IC6.

DISCLOSURE OF THE INVENTION

In the semiconductor module IPM which is configured as described above, external connection terminals connected to each of the switching elements S1 to S6 are required in order to externally output the operation status information for each of the control circuits IC1 to IC6. Therefore, increase in the number of input/output terminals in the semiconductor module IPM is unavoidable. Therefore, in the prior art, the function for outputting the operation status information described above is provided at least in a particular control circuit IC of the semiconductor module IPM. Moreover, it has also been proposed that the operation status information be reported between the plurality of control circuits IC1 to IC6, and when an abnormality is detected, that the operation status information be output externally by the particular control circuit IC only.

When a configuration of this kind is adopted, it is certainly possible to reduce the number of input/output terminals in the semiconductor module IPM. However, in this case, it inevitably takes time for the operation status information to be output externally after detection of an abnormality. Moreover, in an external control device which controls the operation of the semiconductor module IPM, there are problems in that it takes time for the type of abnormality occurring in the semiconductor module IPM to be determined, and for the protection function of the semiconductor module IPM to operate appropriately.

The present invention was devised in view of these circumstances, an object thereof being to provide a semiconductor module having a simple configuration wherein operation status information of a plurality of control circuits can be output externally without increasing the number of input/output terminals, and furthermore, a protection operation can be started up rapidly in relation to abnormalities detected in each control circuit.

In order to achieve the object described above, the semiconductor module relating to the present invention includes a plurality of power semiconductor elements constituted by IGBTs or MOS-FETs; a plurality of control circuits which respectively drive the semiconductor elements on and off; and a plurality of signal output circuits which are provided respectively for the control circuits and which input and output operation status information, wherein the signal output circuits, in particular, are respectively constituted by switch circuits provided with a signal output terminal having an open-drain configuration, the signal output terminals of the signal output circuits each are connected to an internal lead frame on which the power semiconductor elements and the control circuits of the semiconductor module are mounted.

Alternatively, the signal output circuits, in particular, are each constituted by switch circuits provided with a signal output terminal having an open-connector configuration, and the signal output terminals of the signal output circuits each are connected to an internal lead frame on which the power semiconductor elements and the control circuits of the semiconductor module are mounted.

Desirably, at least one of the plurality of signal output circuits is configured so that the signal output terminal thereof is pulled up or pulled down via a resistance in the control circuit. Alternatively, a configuration may be adopted wherein the internal lead frame to which the output terminals of the plurality of signal output circuits are respectively connected is pulled up or pulled down via a resistance. It is also possible for a particular output terminal of the semiconductor module to which the internal lead frame has been connected to be pulled up or pulled down via a resistance outside the semiconductor module. Furthermore, desirably, switching elements forming the signal output terminals of the open-collector configuration or the open-drain configuration in the plurality of signal output circuits have mutually different output resistance values in each respective signal output circuit.

The operation status information output by the plurality of signal output circuits is abnormality information indicating abnormal operation of the power semiconductor elements. Furthermore, desirably, the control circuits are provided with protection circuits which detect the operation status information output by the internal lead frame and halt the driving of the power semiconductor elements.

According to the semiconductor module relating to the present invention, the plurality of signal output circuits which are provided respectively for each of the plurality of control circuits and which output the operation status information are provided with output terminals in an open-drain configuration or an open-collector configuration, in such a manner that the output terminals are connected respectively to the internal lead frame of the semiconductor module in a wired on connection. Therefore, it is possible to collect the output terminals into one and to externally output the operation status information which is output respectively from the control circuits, irrespective of the number of the plurality of control circuits. Consequently, it is possible to configure a semiconductor module without leading to an increase in the number of input/output terminals for external connection.

Moreover, each control circuit can externally output the operation status information of the circuit, via the internal lead frame to which the output terminal of the signal output circuit is connected in a wired on connection, and furthermore, the other control circuits can each acquire the operation status information output externally by other control circuits, via the internal lead frame. Consequently, abnormality information detected in another control circuit can be acquired rapidly and simply, and appropriate abnormality countermeasures can be implemented. Furthermore, the output resistance values of the switching elements which form the signal output terminals of the open-drain configuration or the open-collector configuration, in other words, the on resistances of the switching elements, can be made mutually different in each signal output circuit. In this way, it is possible easily to detect, from a voltage change in the signal output terminal when an abnormality is detected, which signal output circuit has output the operation status information which is an abnormal signal. Therefore, the abnormality countermeasure function can be consolidated simply and efficiently, and many varied practical advantages are obtained.

BEST MODE FOR CARRYING OUT THE INVENTION

Below, a semiconductor module relating to one embodiment of the present invention is described below with reference to the drawings.

Figure 1:
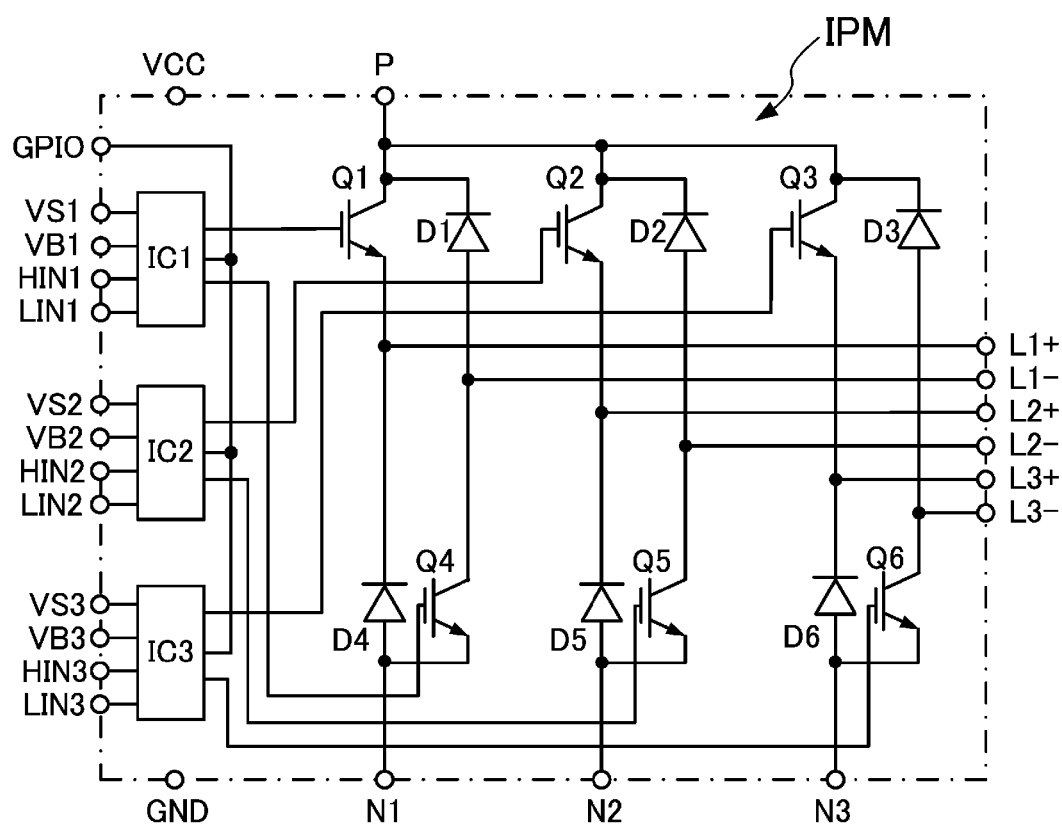
FIG. 1 is a general schematic drawing of a semiconductor module relating to one embodiment of the present invention.

FIG. 1 is a general schematic drawing of the semiconductor module IPM relating to the present invention. The semiconductor module IPM shown in FIG. 1 is provided with six switching elements Q1, Q2 to Q6 and six freewheeling diodes D1, D2 to D6 which form three half-bridge circuits. Furthermore, the semiconductor module IPM is constituted by three control circuits IC1, IC2, IC3 which drive the switching elements Q1, Q2 to Q6 on and off respectively in complementary fashion, for each of the half-bridge circuits. Here, a semiconductor module IPM which forms three half-bridge circuits is described, but it is also possible to form two or four or more half-bridge circuits.

Incidentally, the six switching elements Q1, Q2 to Q6 are constituted by IGBTs, for example, and basically, are connected in series in pairs of two elements each, so as to form three half-bridge circuits. Moreover, basically, the six freewheeling diodes D1, D2 to D6 are connected inversely in parallel to each of the switching elements Q1, Q2 to Q6, as described above, so as to form a free-wheeling current path.

Figure 2:
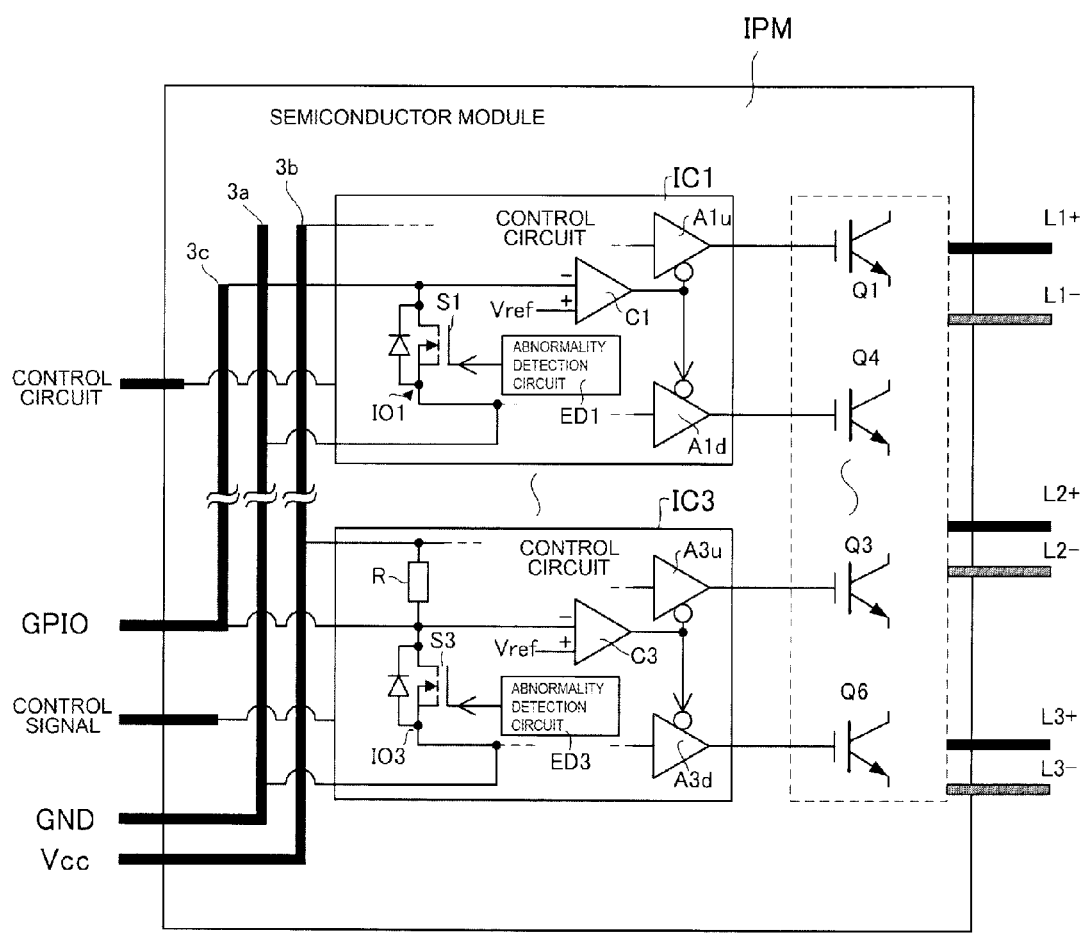
FIG. 2 is a diagram showing a general configuration of a control circuit provided in the semiconductor module.

Furthermore, the control circuits IC1, IC2, IC3 are each provided with output amplifiers A1$u$, A1$d$ to A3$u$, A3$d$ which apply drive signals in complementary fashion to the gate, which is the control electrode, of each of the switching elements Q1, Q2 to Q6 that form the half-bridge circuits, as indicated by the schematic view in FIG. 2, for example. Moreover, the control circuits IC1 to IC3 are respectively provided with abnormality detection circuits ED1 to ED3 which detect abnormalities, such as overcurrent or overheating, in the switching elements Q1, Q2 to Q6, by monitoring the current flowing in the switching elements Q1, Q2 to Q6, and/or the operating temperature thereof, etc.

The control circuits IC1, IC2, IC3 are configured so as to prohibit the operation of the output amplifiers A1$u$, A1$d$ to A3$u$, A3$d$, via the output control circuits C1 to C3 which are protection circuits, as described below, when an abnormality is detected by the abnormality detection circuits ED1 to ED3, thereby protecting the switching elements Q1, Q2 to Q6. Furthermore, the control circuits IC1, IC2, IC3 are configured so as to externally output abnormality information about the overcurrent and/or overheating, and the like, that has been detected respectively by the abnormality detection circuits ED1 to ED3, as operation status information for the control circuits IC1 to IC3, via signal output circuits IO1 to IO3 of which the main components are the switching elements S1 to S3 constituted by n-type MOSFETs, for example.

Here, the switching elements S1 to S3 respectively form signal output circuits IO1 to IO3 having a so-called open drain configuration. The drain, which is the signal output terminal, of each of the switching elements S1 to S3 of MOS-FETs, are respectively connected to an internal lead frame 3c, which is described hereinafter. When the switching elements S1 to S3 are constituted by bipolar transistors, for example, then the signal output terminals of the switching elements S1 to S3 form collectors. Therefore, in this case, the switching elements S1 to S3 may have an open-collector configuration.

Furthermore, the signal output terminal of one of the signal output circuits IO1 to IO3, and specifically, the signal input/output terminal IO3 is connected to the power source voltage Vcc via a pull-up resistance R inside the control circuit IC3. The output control circuits C1 to C3 described above detect the operation status information by comparing the voltages of the signal output terminals of the signal output circuits IO1 to IO3, in other words, the voltage of the internal lead frame 3c, respectively, with a predetermined threshold voltage Vref.

Figure 3:
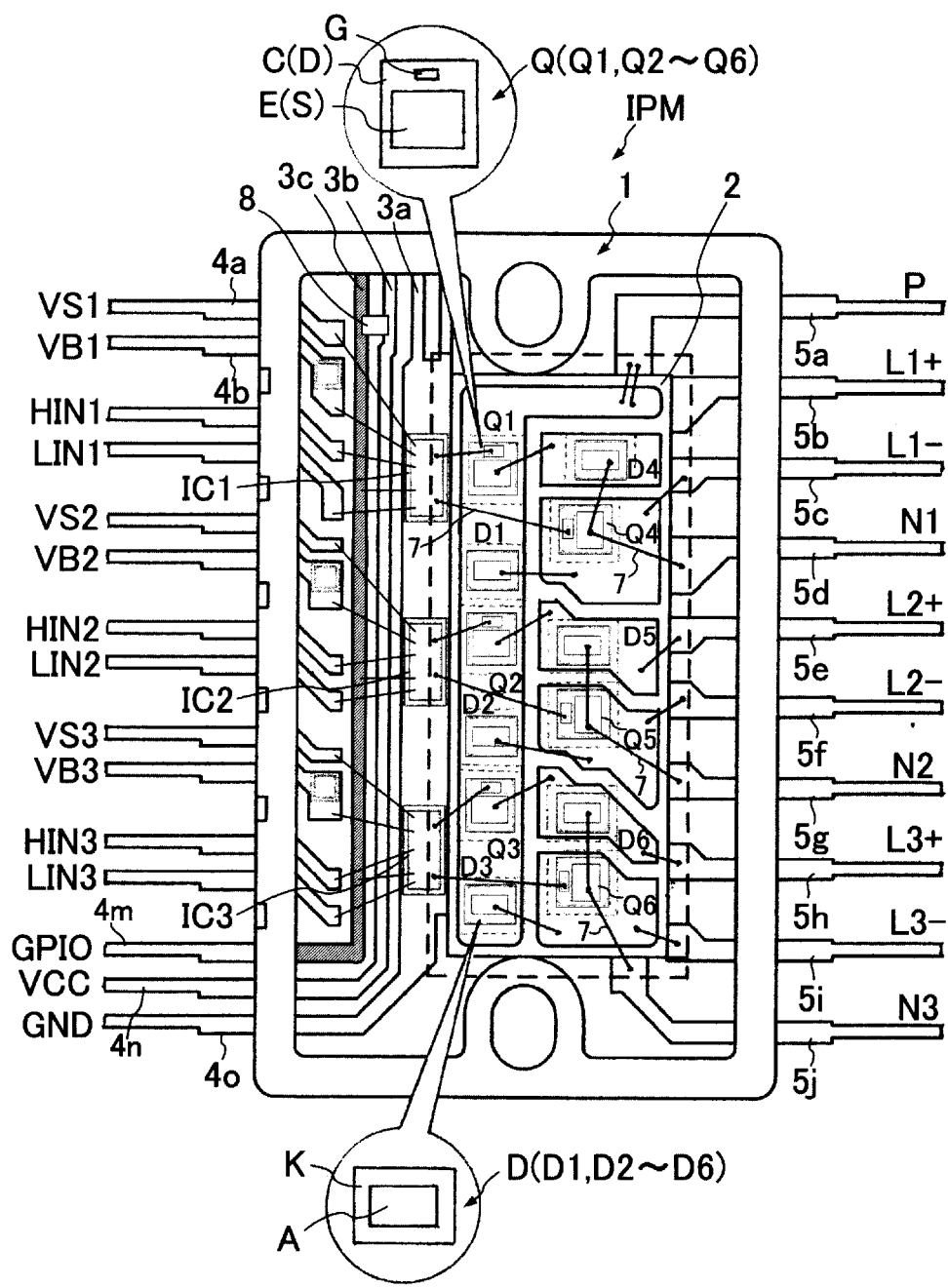
FIG. 3 is a diagram showing a layout structure of the semiconductor module shown in FIG. 1.
Figure 4:
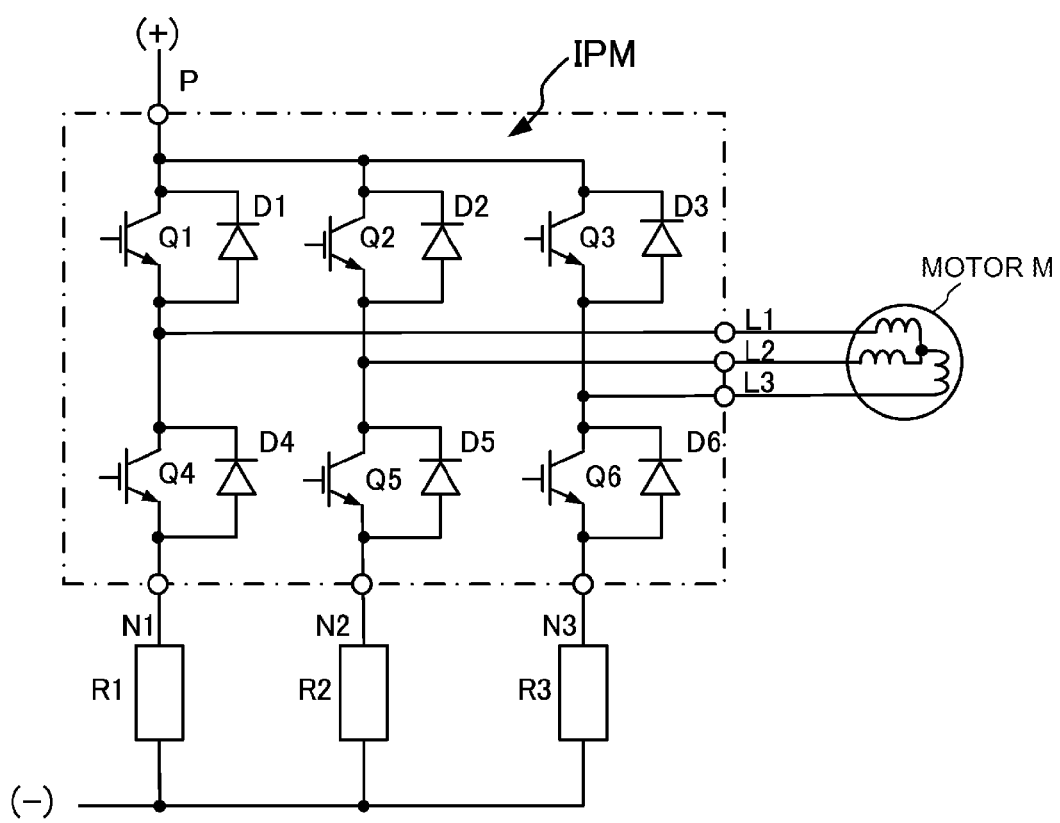
FIG. 4 is a diagram showing an example of the configuration of an output stage of a general semiconductor module according to the prior art, which is used in an inverter device that drives a tri-phase motor.
Figure 5:
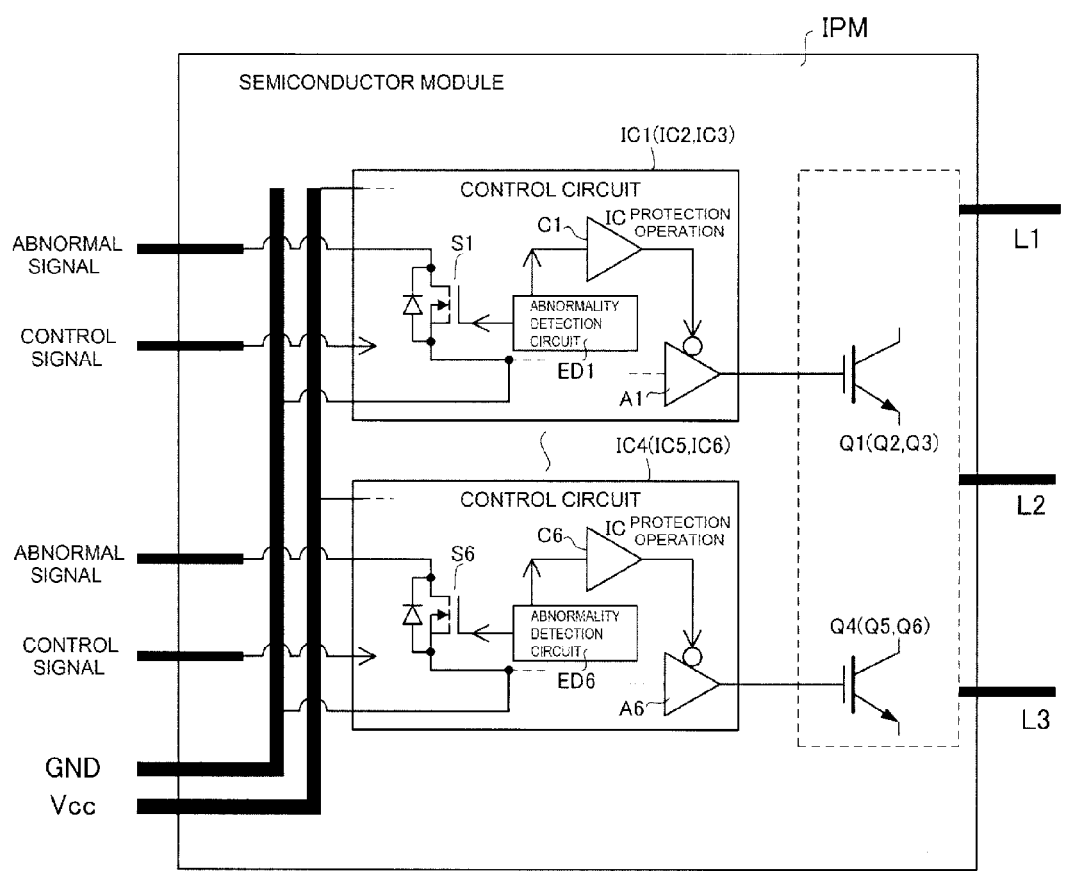
FIG. 5 is a diagram showing a general configuration of a control circuit provided in a semiconductor module according to the prior art.

FIG. 3 shows a layout structure of a semiconductor module IPM provided with the plurality of switching elements Q1, Q2 to Q6 constituted by IGBTs described above, the free-wheeling diodes D1, D2 to D6, and the control circuits IC1 to IC3. The semiconductor module IPM is provided with an insulating substrate 2 constituted by an Al substrate, for example, which is disposed in substantially the central portion of a terminal case which forms a rectangular frame main body 1. The switching elements Q1, Q2 to Q6 and the free-wheeling diodes D1, D2 to D6 are installed respectively in one row on the insulating substrate 2. Furthermore, the control circuits IC1 to IC3 are arranged on the internal lead frame 3a, described below, which is used as a ground line, for instance.

In the drawings, 3 (3a to 3c) are internal lead frames forming a plurality of internal wiring patterns which are conductor layers, and 4 (4a to 4o) and 5 (5a to 5j) respectively indicate a plurality of lead frames which form control terminals for external connection. The lead frames 4 (4a to 4o) which are aligned on one side of the frame main body 1 serve to input and output control signals, and the like, to the control circuits IC1, IC2, IC3. Furthermore, the lead frames 5 (5a to 5j) which are aligned on the other side of the frame main body 1 serve to supply, externally, the current which is output respectively by the switching elements Q1, Q2 to Q6.

The semiconductor module IPM is configured by respectively connecting the switching elements Q1, Q2 to Q6, the free-wheeling diodes D1, D2 to D6 and the control circuits IC1 to IC3, to the internal lead frames 3 (3a to 3c) and the lead frames 4 (4a to 4o), 5 (5a to 5j), by using bonding wires 7 made of Au wire, for example.

In this embodiment, as shown in FIG. 1, the emitters, which are the low potential-side electrodes of the switching elements Q1, Q2, Q3 on the upper arm side in a plurality of, for example, three, half-bridge circuits, and the collectors, which are the high potential-side electrodes of the switching elements Q4, Q5, Q6 on the lower arm side, are connected respectively and independently to the lead frames 5a, 5b to 5j, which are the plurality of external connection output terminals, as shown in FIG. 3.

As shown in FIG. 1, in the free-wheeling diodes D4, D5, D6 which are provided on the lower arm side of the half-bridge circuits, the cathodes are connected respectively in series to the emitters of the switching elements Q1, Q2, Q3 on the upper arm side. Furthermore, the anodes of the free-wheeling diodes D4, D5, D6 are respectively connected to the emitters of the switching elements Q4, Q5, Q6 on the lower arm side.

Furthermore, in the free-wheeling diodes D1, D2, D3 provided on the upper arm side, the cathodes are each connected commonly to the collectors of the switching elements Q1, Q2, Q3 on the upper arm side. The anodes of the free-wheeling diodes D1, D2, D3 are respectively connected in series to the collectors of the switching elements Q4, Q5, Q6 on the lower arm side.

In other words, in this example, the switching elements Q1, Q2, Q3 on the upper arm side and the free-wheeling diodes D4, D5, D6 on the lower arm side are respectively connected in series, and the switching elements Q4, Q5, Q6 on the lower arm side and the free-wheeling diodes D1, D2, D3 on the upper arm side are respectively connected in series. Furthermore, the six serial circuits constituted by the switching elements Q and the free-wheeling diodes D are arranged in a parallel configuration.

The connection points between the switching elements Q and the free-wheeling diodes D in the respective serial circuits are each connected individually to the six respectively independent lead frames 5 (5b, 5c, 5e, 5f, 5h, 5i), as shown in FIG. 3, and are extracted externally as external connection output terminals L1+, L1−, L2+L2−, L3+, L3−. These external connection output terminals L1+, L1−, L2+, L2−, L3+, L3− are provided in order to enable the inductance of a coil or transformer to be interposed between the upper arm-side switching elements Q1 (Q2, Q3) and the lower arm-side switching elements Q4 (Q5, Q6), when configuring a double-forward converter or interleaved voltage-raising converter, etc.

Furthermore, the collectors of the switching elements Q1, Q2, Q3 on the upper arm side and the cathodes of the free-wheeling diodes D1, D2, D3 are mutually connected commonly, and are connected to one of the lead frames 5, and more specifically, the lead frame 5a, which is extracted externally as a power source terminal P. Moreover, the emitters of the lower arm-side switching elements Q4, Q5, Q6 are each connected independently to separate lead frames 5 (5d, 5g, 5j) among the ten lead frames 5, and are extracted externally as external connection output terminals N1, N2, N3.

As shown respectively in FIG. 2 and FIG. 3, the signal output terminals of the signal output circuits IO1 to IO3 in the control circuits IC1, IC2, IC3 are respectively connected to the internal lead frame 3c using the bonding wire 7, and are extracted externally as operation status information output terminals GPIO. In FIG. 3, an example is depicted in which a pull-up resistance 8 is installed between the internal lead frame 3c and the internal lead frame 3b which is used as a supply line for the power source voltage Vcc, instead of the pull-up resistance R which is incorporated into the control circuit IC3 as described above.

According to the semiconductor module IPM which is configured as described above, the switching elements S1 to S3 which are constituted by MOS-FETs that make up the signal output circuits IO1 to IO3 in the plurality of control circuits IC1, IC2, IC3 each have an open-drain configuration. The drain which is the signal output terminal of the switching elements S1 to S3 is connected to the internal lead frame 3c, and is pulled up to the power source voltage Vcc via the pull-up resistance 8. When the switching elements S1 to S3 which constitute the signal output circuits IO1 to IO3 are bipolar transistors, or the like, then an open-collector configuration may be adopted as described above.

As a result of this, the operation status information output respectively from the control circuits IC1, IC2, IC3, and more specifically, the signal output circuits IO1 to IO3, forms a wired OR connection in the internal lead frame 3c and is output externally via the operation status information output terminal GPIO. Consequently, there is no need to provide a plurality of output terminals for the operation status information, as in the prior art, and hence there is no increase in the number of input/output terminals in the semiconductor module IPM.

Furthermore, the operation status information which is output externally from a particular control circuit IC1 (IC2, IC3) is detected in the output control circuit C1 (C2, C3) of the control circuit IC1 (IC2, IC3), and is detected respectively in the output control circuits C2, C3 (C1) of the other control circuits IC2, IC3 (IC1) via the internal lead frame 3c. As a result of this, the control circuit IC1 (IC2, IC3) prohibits the operation of the output amplifiers A1u, A1d to A3u, A3d, universally, in accordance with the operation status information.

Consequently, when an abnormality in the switching elements Q1, Q2 to Q6 is detected in any one of the plurality of control circuits IC1, IC2, IC3, operation is prohibited in substantially simultaneous fashion in all of the plurality of switching elements Q1, Q2 to Q6, thus providing rapid protection from the abnormality. Therefore, according to the present invention, it is possible to execute protection operations by the plurality of control circuits IC1, IC2, IC3 in relation to the switching elements Q1, Q2 to Q6, respectively in a reliable fashion in the semiconductor module IPM, without increasing the number of external connection terminals for input/output of various information, with the simple configuration described above. Therefore, the practical advantages are many and various.

Furthermore, by making the on resistances of the switching elements S1 to S3, constituted by MOS-FETs which form the signal output terminal of the open-drain configuration, different from one another for each signal output circuit, it is also possible to detect which signal output circuit has output the operation status information, from the voltage change at the signal output terminal when an abnormality is detected.

The present invention is not limited to the embodiment described above. For instance, the pull-up resistance described above can also be disposed so as to pull up the operation status information output terminal GPIO outside the semiconductor module IPM. Moreover, an example has been described in which the drains of the switching elements S1 to S3 constituted by MOS-FETs having an open-drain configuration are pulled up to the power source voltage Vcc. However, when p-type MOS-FETs are used as the switching elements S1 to S3, for example, then needless to say, a configuration may be adopted in which the drains of the switching elements S1 to S3 having an open-drain configuration are pulled down to ground potential GND.

Furthermore, when bipolar transistors are used as the switching elements S1 to S3, then needless to say, the switching elements S1 to S3 may have an open-collector configuration.

Moreover, the control circuits IC1, IC2, IC3 may also be disposed so as to correspond respectively to the switching elements Q1, Q2 to Q6, for example. Furthermore, a prescribed number of control circuit ICs may be collected into a single chip. More specifically, it is possible to adopt a configuration wherein, for example, one control circuit IC1 formed into a single chip is provided for the switching elements Q1, Q2, Q3, and one control circuit IC2 formed into a single chip is provided for the remaining switching elements Q4, Q5, Q6.

Furthermore, the number of switching elements Q which are installed in the semiconductor module IPM is not limited to that of the embodiment described above. Moreover, power MOS-FETs can, of course, be used for the switching elements Q. Furthermore, the signal output circuits IO1 to IO3 may, as appropriate, adopt various circuit configurations that have been proposed in the prior art. Apart from this, the present invention can be implemented with various modifications within a scope that does not depart from the essence of the invention.

The invention claimed is:

1. A semiconductor module, comprising:
   a plurality of power semiconductor elements;
   a plurality of control circuits that respectively drive the semiconductor elements on and off; and
   a plurality of signal output circuits that output operation status information and are respectively connected to the plurality of control circuits;
   a plurality of signal output terminals having an open-drain configuration and respectively connected to the plurality of signal output circuits;
   an internal lead frame connected to each of the plurality of signal output terminals; and
   a circuit substrate upon which the internal lead frame, the plurality of power semiconductor elements and the plurality of control circuits are mounted;
   wherein semiconductor elements forming the signal output terminals have different output resistance values in the respective signal output circuits.

2. The semiconductor module according to claim 1, wherein a potential of the signal output terminal of one of the plurality of signal output circuits is pulled up or pulled down via a resistance inside the control circuit.

3. The semiconductor module according to claim 1, wherein a potential of the internal lead frame is pulled up or pulled down via a resistance.

4. The semiconductor module according to claim 1, wherein the operation status information is abnormality information indicating abnormal operation of the power semiconductor elements.

5. The semiconductor module according to claim 1, wherein the plurality of control circuits are each provided with a protection circuit which detects the operation status information output to the internal lead frame and halts driving of the plurality of power semiconductor elements.

6. A semiconductor module, comprising:
   a plurality of power semiconductor elements;
   a plurality of control circuits that respectively drive the semiconductor elements on and off; and
   a plurality of signal output circuits that output operation status information and are respectively connected to the plurality of control circuits;
   a plurality of signal output terminals having an open-collector configuration and respectively connected to the plurality of signal output circuits;
   an internal lead frame connected to each of the plurality of signal output terminals; and
   a circuit substrate upon which the internal lead frame, the plurality of power semiconductor elements and the plurality of control circuits are mounted;
   wherein semiconductor elements forming the signal output terminals have different output resistance values in the respective signal output circuits.

7. The semiconductor module according to claim 6, wherein a potential of the signal output terminal of one of the plurality of signal output circuits is pulled up or pulled down via a resistance inside the control circuit.

8. The semiconductor module according to claim 6, wherein a potential of the internal lead frame is pulled up or pulled down via a resistance.

9. The semiconductor module according to claim 6, wherein the operation status information is abnormality information indicating abnormal operation of the power semiconductor elements.

10. The semiconductor module according to claim 6, wherein the plurality of control circuits are each provided with a protection circuit which detects the operation status information output to the internal lead frame and halts driving of the plurality of power semiconductor elements.

11. A semiconductor module, comprising:
- a plurality of power semiconductor elements;
- a plurality of control circuits that respectively drive the semiconductor elements on and off; and
- a plurality of signal output circuits that output operation status information and are respectively connected to the plurality of control circuits;
- a plurality of signal output terminals respectively connected to the plurality of signal output circuits; and
- an internal lead frame connected to each of the plurality of signal output terminals;
- wherein semiconductor elements forming the signal output terminals have different output resistance values in the respective signal output circuits.

12. The semiconductor module according to claim 11, wherein a potential of the signal output terminal of one of the plurality of signal output circuits is pulled up or pulled down via a resistance.

13. The semiconductor module according to claim 11, wherein a potential of the internal lead frame is pulled up or pulled down via a resistance.

14. The semiconductor module according to claim 11, wherein the operation status information is abnormality information indicating abnormal operation of the power semiconductor elements.

15. The semiconductor module according to claim 11, wherein the plurality of control circuits are each provided with a protection circuit which detects the operation status information output to the internal lead frame and halts driving of the plurality of power semiconductor elements.

* * * * *